United States Patent
Chu et al.

(10) Patent No.: US 8,405,127 B2
(45) Date of Patent: Mar. 26, 2013

(54) METHOD AND APPARATUS FOR FABRICATING A HETEROJUNCTION BIPOLAR TRANSISTOR

(75) Inventors: Jack O. Chu, Manhasset Hills, NY (US); Francois Pagette, Jefferson Valley, NY (US)

(73) Assignee: International Business Machines Corporation, Armonk, NY (US)

(*) Notice: Subject to any disclaimer, the term of this patent is extended or adjusted under 35 U.S.C. 154(b) by 456 days.

(21) Appl. No.: 12/034,210

(22) Filed: Feb. 20, 2008

(65) Prior Publication Data

US 2009/0206370 A1  Aug. 20, 2009

(51) Int. Cl.
*H01L 21/331* (2006.01)

(52) U.S. Cl. .................... 257/197; 438/312

(58) Field of Classification Search .......... 257/197, 257/163–166, 205, 273, 351, 361, 378, 423, 257/427, 474, 477, 517, 526, 539, 544, 565–593, 257/928, E51.004, E31.069, E27.017, E27.019–E27.023, 257/E27.037–E27.043, E27.053–E27.058, 257/E27.074–E27.078, E27.106, E27.149, 257/E29.03–E29.035, E29.044–E29.045, 257/E29.114, E29.124, E29.171–E29.202, 257/552–562; 438/205, 170, 189, 202, 309–378, 438/235–23

See application file for complete search history.

(56) References Cited

U.S. PATENT DOCUMENTS

| | | | |
|---|---|---|---|
| 6,337,494 B1* | 1/2002 | Ryum et al. ................. | 257/197 |
| 6,417,058 B1 | 7/2002 | Richardson et al. | |
| 6,861,323 B2 | 3/2005 | Shideler | |
| 6,940,149 B1* | 9/2005 | Divakaruni et al. ......... | 257/565 |
| 6,982,442 B2* | 1/2006 | Chan et al. ................. | 257/198 |
| 7,084,485 B2* | 8/2006 | Kirchgessner ............... | 257/577 |
| 2004/0207046 A1* | 10/2004 | Babcock et al. ............. | 257/575 |
| 2009/0050972 A1* | 2/2009 | Lindsay et al. .............. | 257/368 |
| 2009/0065804 A1* | 3/2009 | Pagette et al. ............... | 257/190 |

* cited by examiner

*Primary Examiner* — David Vu
*Assistant Examiner* — Jonathan Han
(74) *Attorney, Agent, or Firm* — Louis J. Percello, Esq.

(57) ABSTRACT

In one embodiment, the invention is a method and apparatus for fabricating a heterojunction bipolar transistor. One embodiment of a heterojunction bipolar transistor includes a collector layer, a base region formed over the collector layer, a self-aligned emitter formed on top of the base region and collector layer, a poly-germanium extrinsic base surrounding the emitter, and a metal germanide layer formed over the extrinsic base.

20 Claims, 12 Drawing Sheets

METHOD AND APPARATUS FOR FABRICATING A HETEROJUNCTION BIPOLAR TRANSISTOR

BACKGROUND OF THE INVENTION

The present invention relates generally to transistors, and relates more particularly to the fabrication of heterojunction bipolar transistors.

As heterojunction bipolar transistor (HBT) switching speeds reach over 350 GHz, further improvement in alternating current (AC) performance becomes increasingly dependent on the reduction of base resistance ($R_b$) (especially in the maximum oscillation frequency, $f_{max}$).

Thus, there is a need in the art for a method and apparatus for fabricating a heterojunction bipolar transistor to reduce base resistance in the extrinsic base.

SUMMARY OF THE INVENTION

In one embodiment, the invention is a method and apparatus for fabricating a heterojunction bipolar transistor. One embodiment of a heterojunction bipolar transistor includes a collector layer, a base region formed over the collector layer, a self-aligned emitter formed on top of the base region and collector layer, a poly-germanium extrinsic base surrounding the emitter, and a metal germanide layer formed over the extrinsic base.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for fabricating a heterojunction bipolar transistor (HBT). Embodiments of the invention reduce the base resistance of an n-p-n transistor by forming a nickel germanide (Ni germanide) layer over a boron-doped poly-germanium (poly-Ge) extrinsic base layer. Further embodiments reduce base resistance by replacing an extrinsic base poly-silicon (poly-Si) layer with a p+ poly-Ge layer and an emitter poly-Si layer with an n+ poly-Ge/Si layer.

The base resistance ($R_b$) of an HBT can be divided into the following components: (1) intrinsic base resistance; (2) extrinsic base poly-to-Si crystal contact resistance; (3) extrinsic base poly sheet resistance; (4) extrinsic base poly-to-extrinsic base silicide contact resistance; and (5) extrinsic base silicide sheet resistance. The base resistance is related to the maximum oscillation frequency ($f_{max}$) of the HBT as follows:

$$f_{max} = \sqrt{\frac{f_T}{8\pi C_{cb} R_b}} \quad \text{(EQN. 1)}$$

FIGS. 1A-1L are cross sectional views illustrating one embodiment of a method for fabricating a heterojunction bipolar transistor 100 with a germanium extrinsic base, according to the present invention. As such, FIGS. 1A-1L also serve as a flow diagram for the inventive method.

Figure 1A:
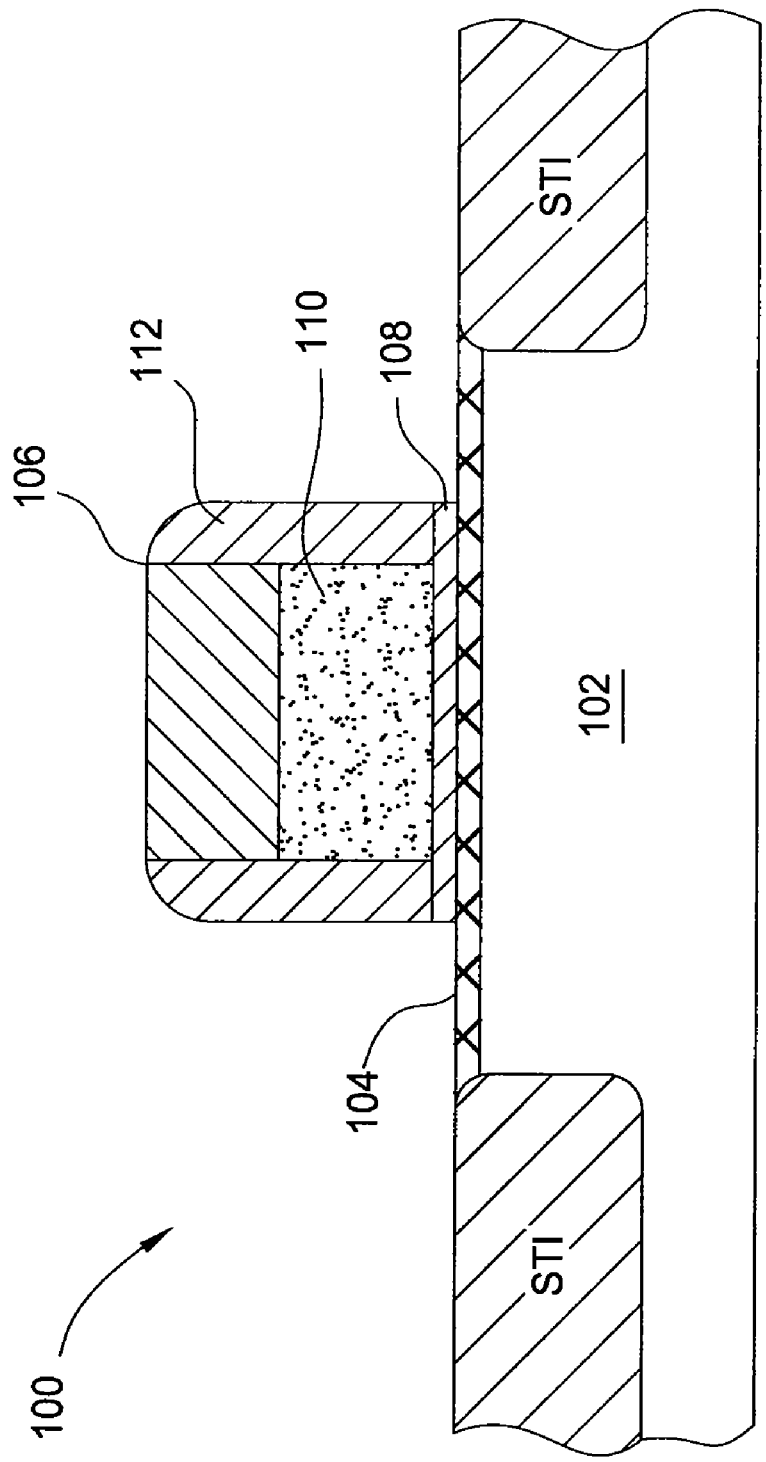
FIGS. 1A-1L are cross sectional views illustrating one embodiment of a method for fabricating a heterojunction bipolar transistor with a germanium extrinsic base, according to the present invention.

As illustrated in FIG. 1A, the method starts with a structure comprising a collector layer 102 (formed, for example, by implantation and annealing) with shallow trench isolation (STI), a single-crystal low-temperature epitaxial (LTE) layer 104 deposited on the collector layer 102, and a mesa 106 formed on the LTE layer 104.

In one embodiment, the LTE layer 104 is a boron-doped silicon germanium (SiGe) layer that forms an intrinsic base region over the collector layer 102, as defined by the opening in the mesa 106. In a further embodiment, the mesa 106 comprises a first oxide layer 108 formed on the LTE layer 104, a first poly-silicon layer 110 formed on a portion of the first oxide layer 108, and a first nitride layer 112 encasing the first poly-silicon layer 110.

Figure 1B:
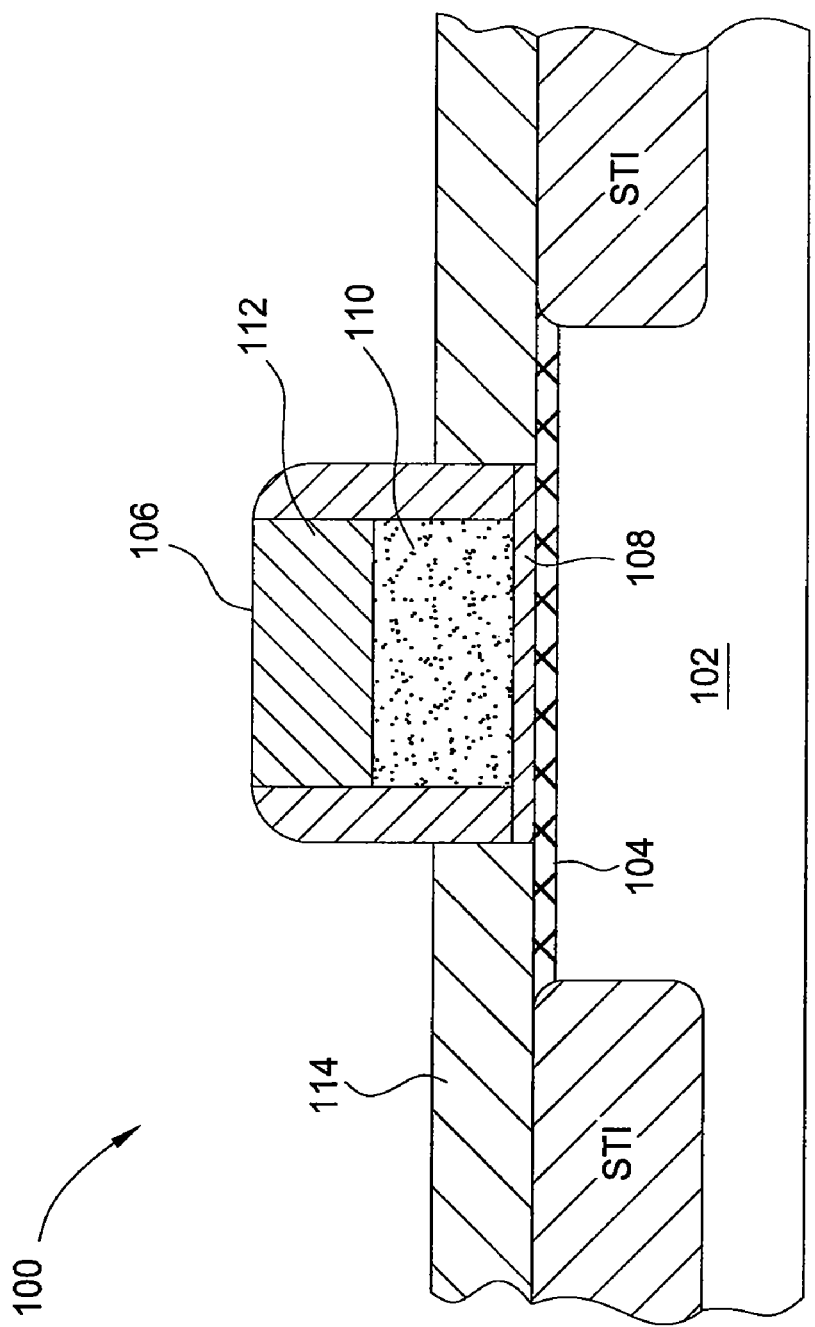

As illustrated in FIG. 1B, a poly-germanium layer 114 is next deposited over the LTE layer 104 to form the extrinsic base. In one embodiment, the poly-germanium extrinsic base 114 comprises boron doped p+ poly-germanium. In certain regions residing directly above the LTE layer 104, the germanium extrinsic base 114 may remain a near-single-crystalline p+ germanium layer as well. In one embodiment, the poly-germanium extrinsic base 114 is deposited by chemical vapor deposition (CVD). In a further embodiment, the CVD process is followed by chemical mechanical planarization (CMP) and reactive ion etching (RIE).

Figure 1C:
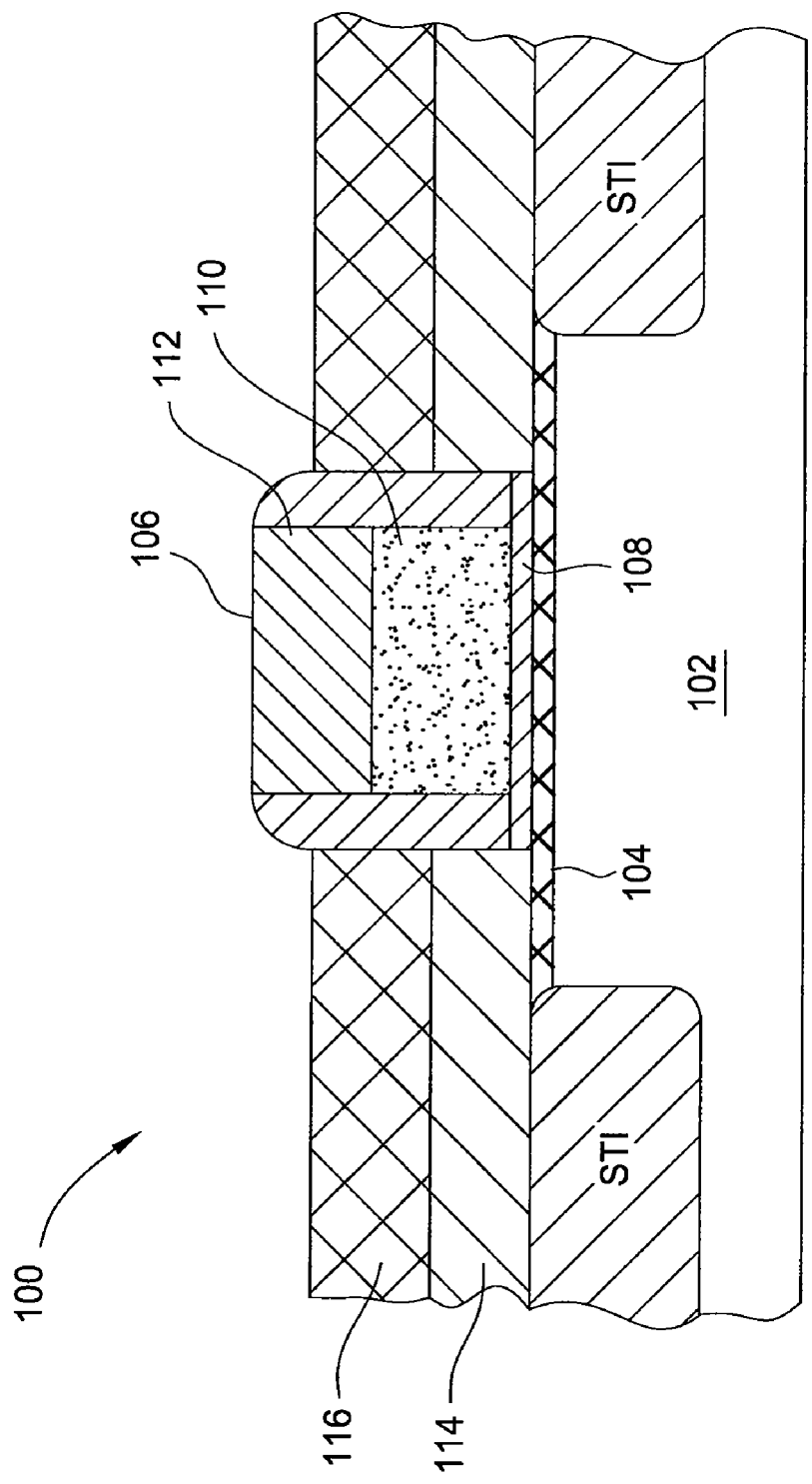
Figure 1D:
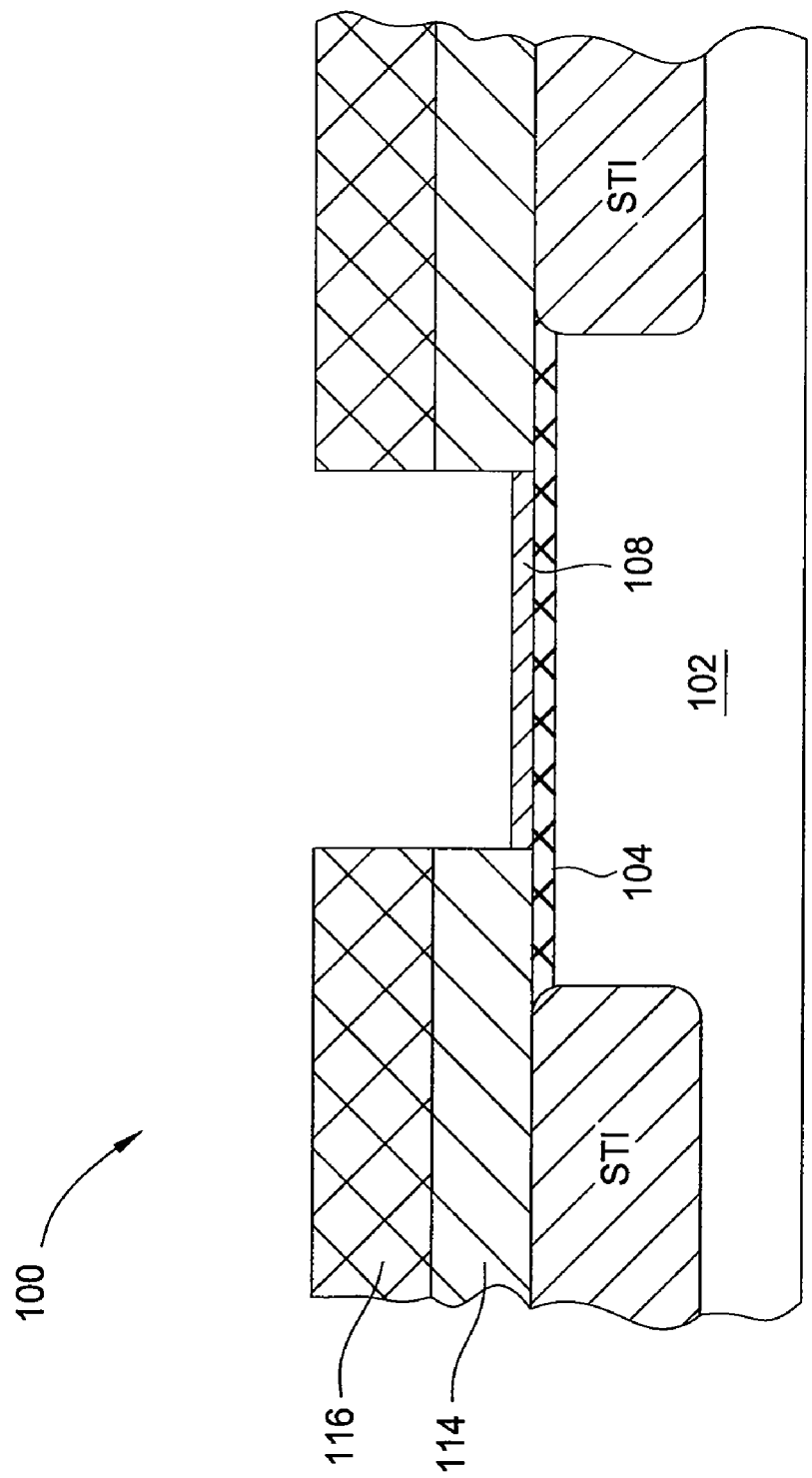

Next, a second oxide layer 116 is deposited over the poly-germanium extrinsic base 114, as illustrated in FIG. 1C. In one embodiment, the deposition of the second oxide layer 116 is followed by CMP. As illustrated in FIG. 1D, the first nitride layer 112 and the first poly-silicon layer 110 are next etched down to the first oxide layer 108, leaving a trench in the poly-germanium extrinsic base 114 and the second oxide layer 116. In one embodiment, the first nitride layer 112 and the first poly-silicon layer 110 are etched using RIE.

Figure 1E:
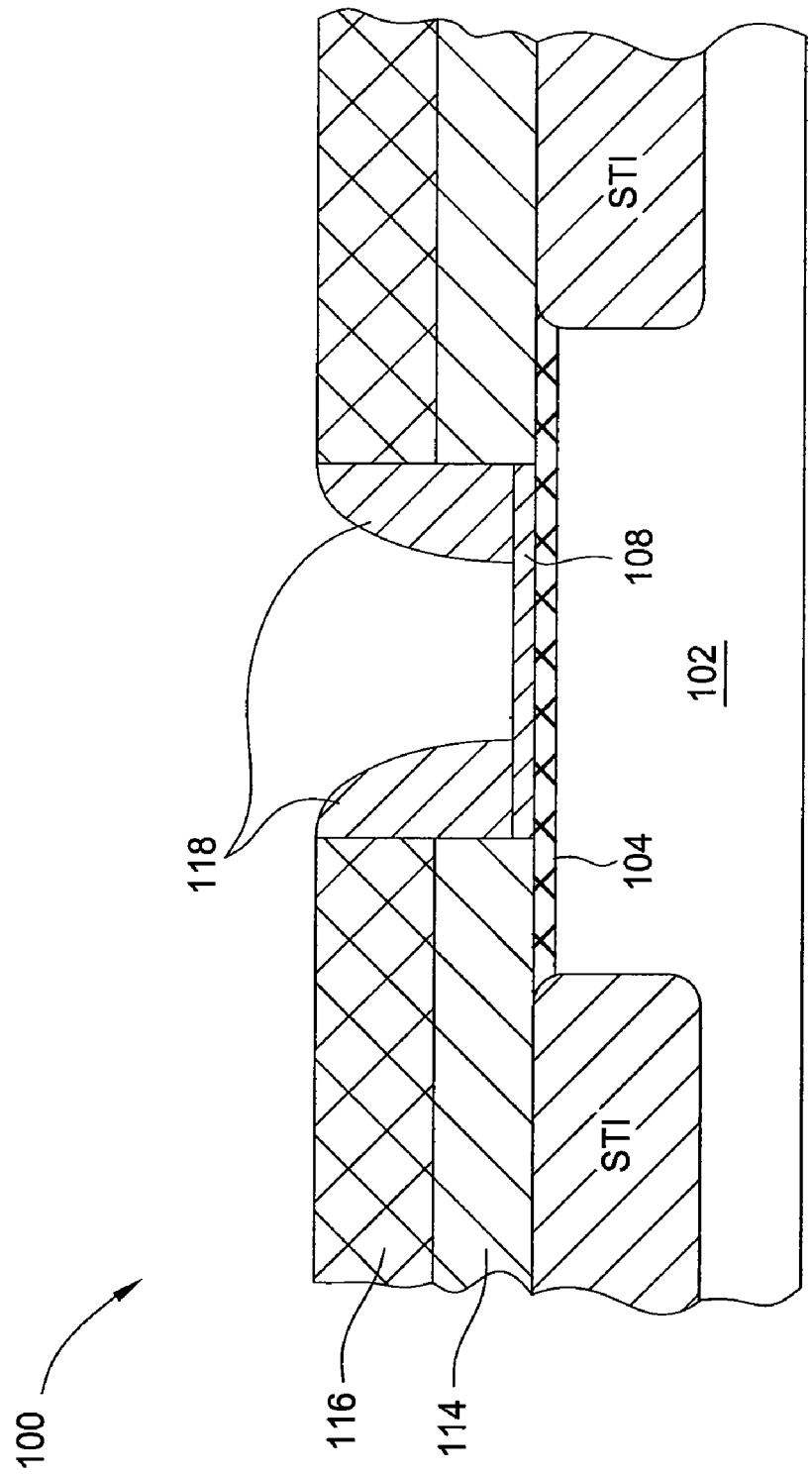
Figure 1F:
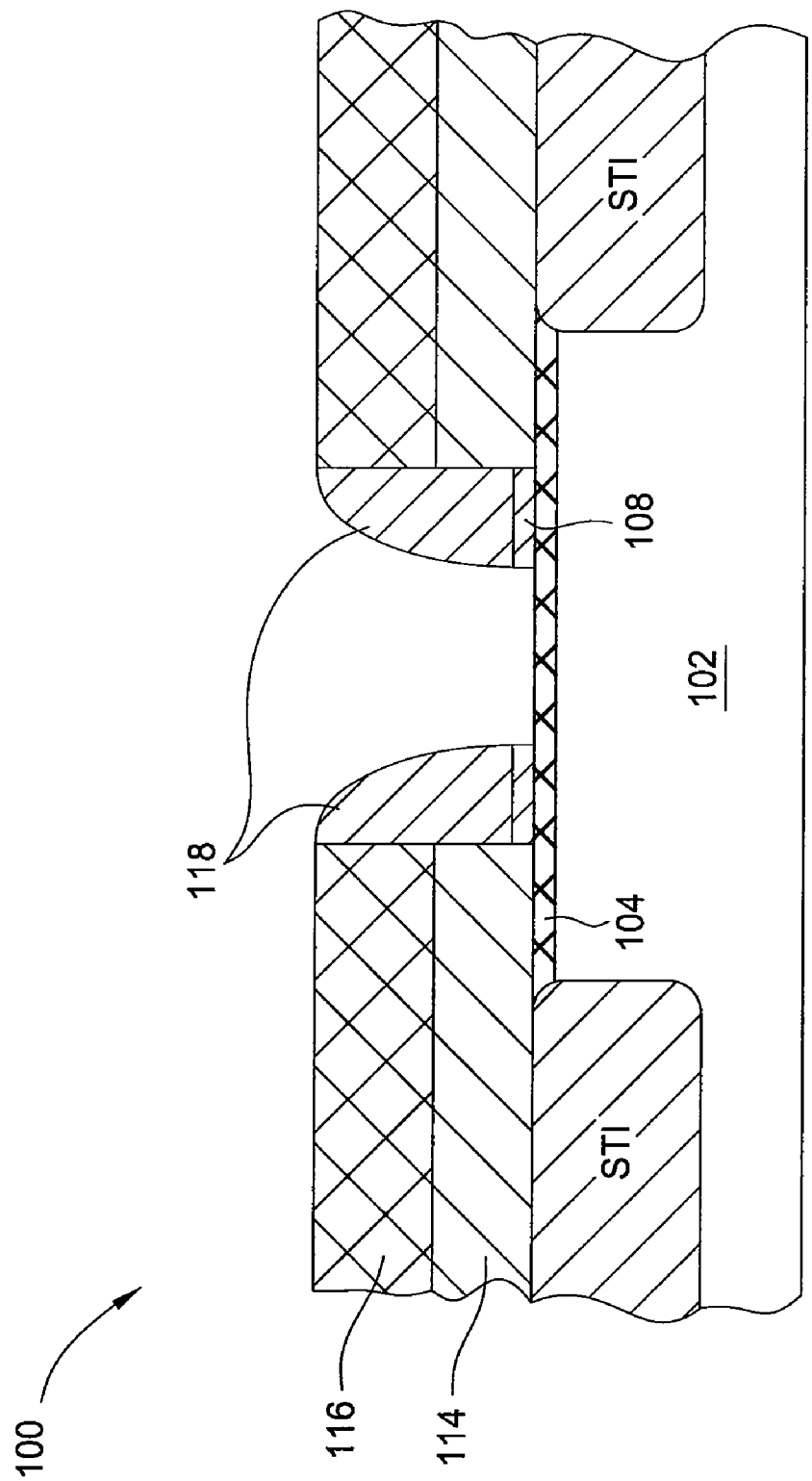

As illustrated in FIG. 1E, the sidewalls of the trench created in FIG. 1D are next lined with a second nitride layer 118, which forms a first spacer. In another embodiment, this spacer is formed from any dielectric material. In one embodiment, deposition of the second nitride layer 118 is followed by RIE. The first oxide layer 108 is next etched to the LTE layer 104, except for the portions of the first oxide layer 108 that are lined by the second nitride layer 118, as illustrated in FIG. 1F. In one embodiment, etching of the first oxide layer 108 in accordance with FIG. 1F is performed using wet etch with dilute hydrogen fluoride (DHF).

Figure 1G:
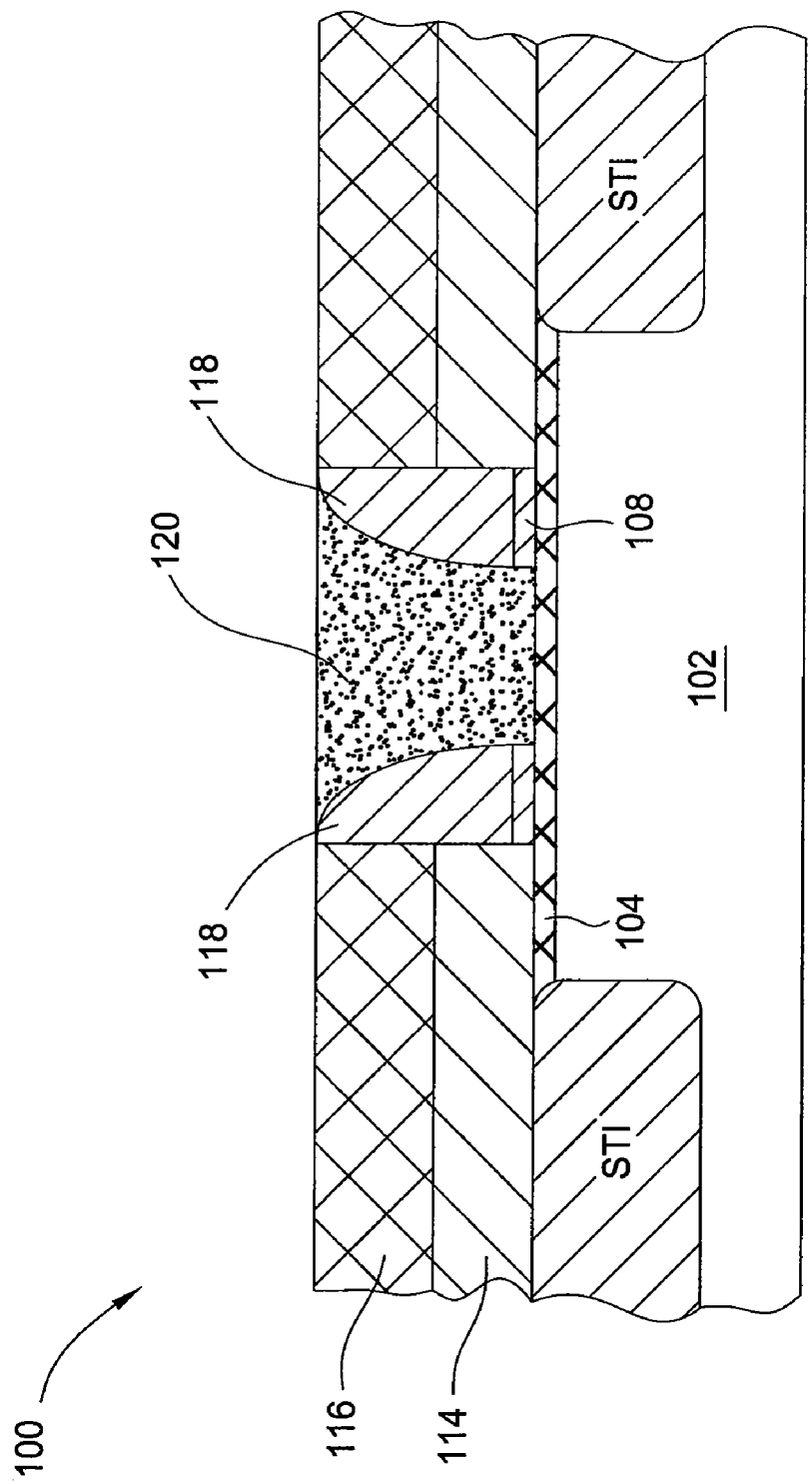
Figure 1H:
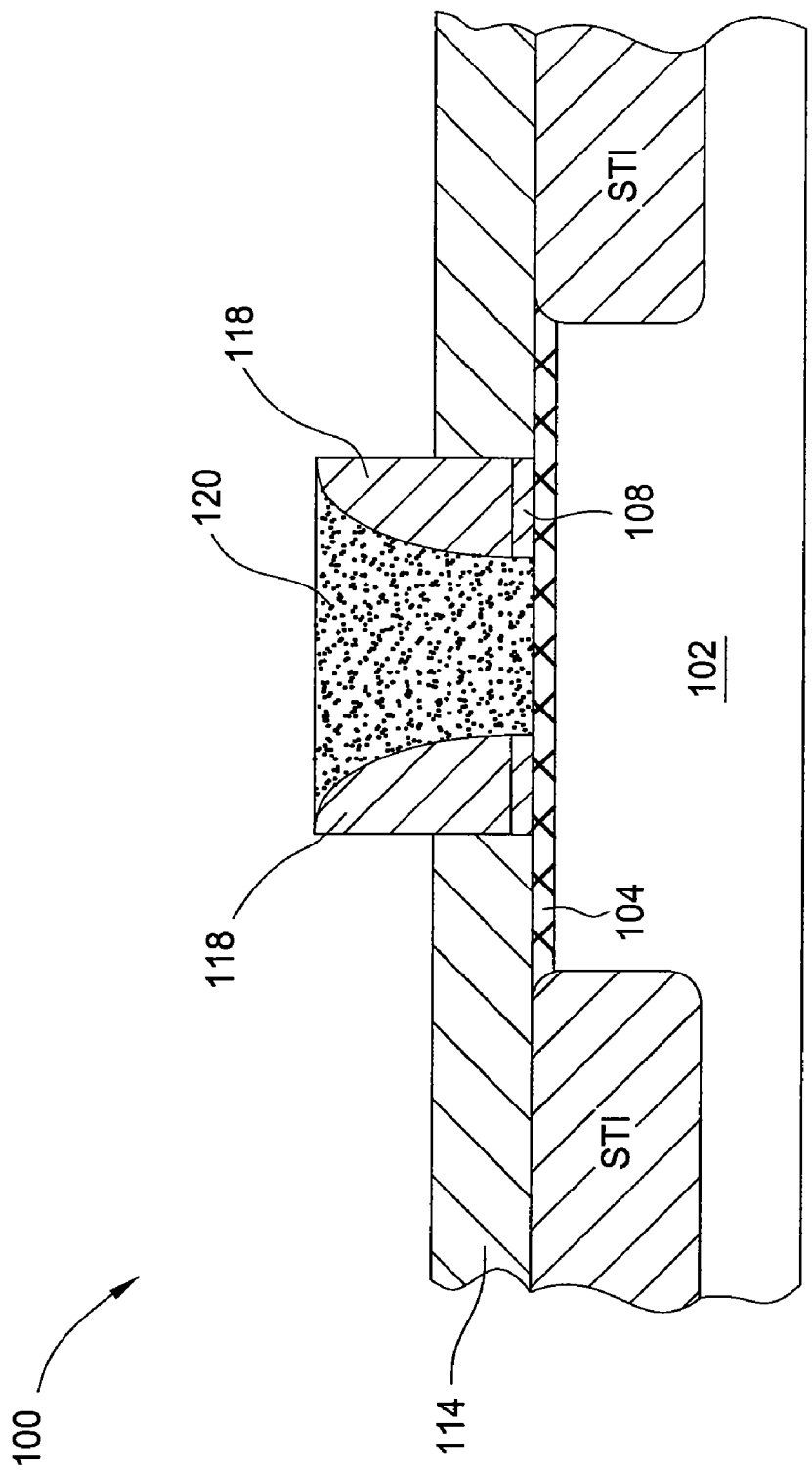

As illustrated in FIG. 1G, the remainder of the trench created in FIG. 1D is next filled in with a second poly-silicon layer 120 to form an emitter. In another embodiment, the trench created in FIG. 1D is filled with n+ poly-germanium and silicon. In one embodiment, the poly-silicon emitter 120 is deposited by CVD. The second oxide layer 116 is next etched to the poly-germanium extrinsic base 114, as illustrated in FIG. 1H. In one embodiment, the second oxide layer 116 is etched by hydrogen fluoride (HF) wet etch or by RIE.

Figure 1I:
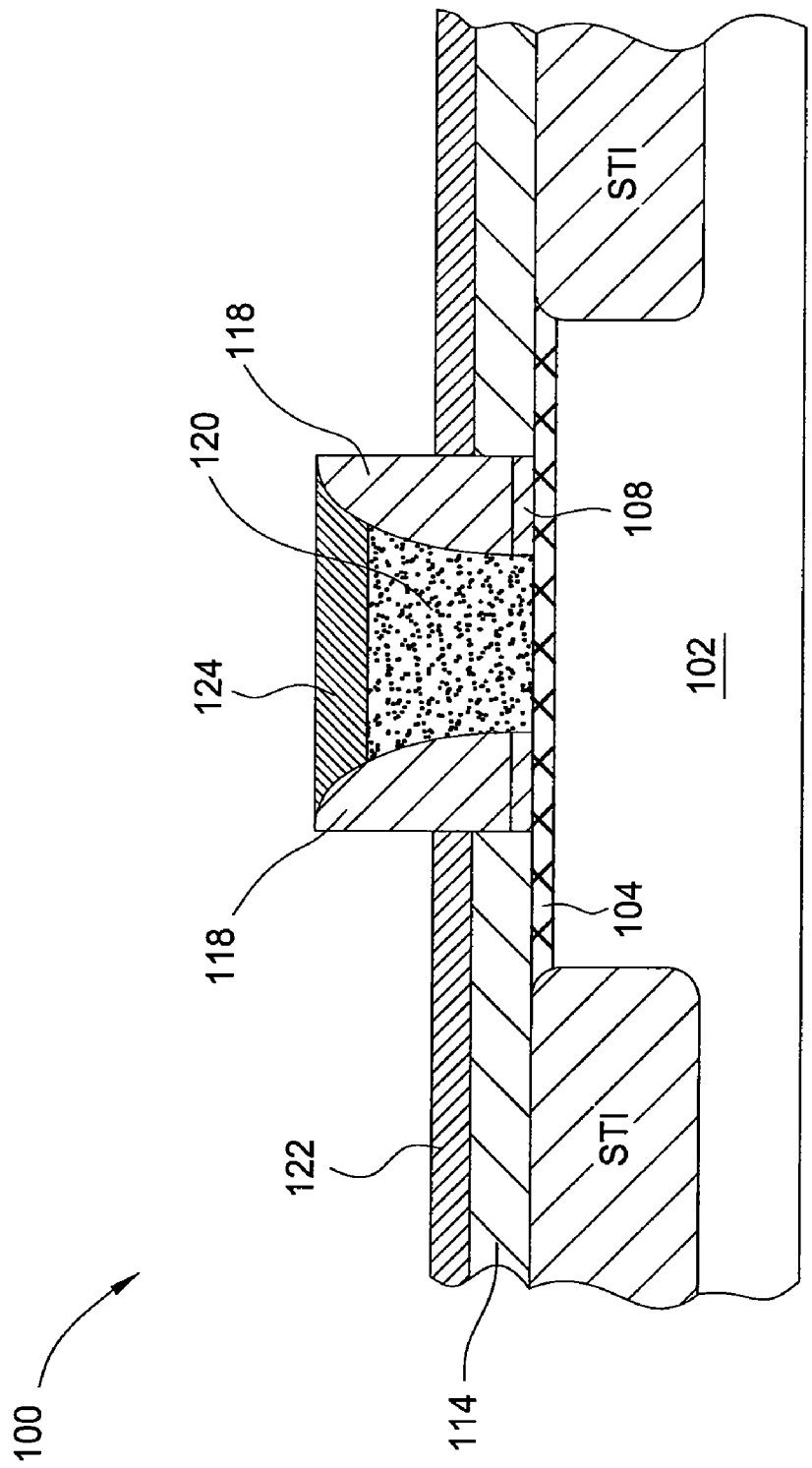

As illustrated in FIG. 1I, a metal germanide layer 122 is next deposited on the extrinsic base of the poly-germanium extrinsic base 114 to form an additional extrinsic base layer. In one embodiment, the metal germanide layer 122 comprises nickel germanide (Ni germanide) or nickel platinum germanide (NiPt germanide). In another embodiment, the metal germanide layer 122 comprises at least one of: titanium germanide (Ti germanide), zirconium germanide (Zr germanide), erbium germanide (Er germanide), and ytterbium germanide (Yb germanide). In one embodiment, formation of the metal germanide layer 122 comprises a metal deposition step (e.g., nickel or nickel alloy deposition) followed by rapid thermal annealing (RTA)). Additionally, as illustrated in FIG. 1I, a nickel suicide layer 124 is deposited over the polysilicon emitter 120. Unreactive metals are then chemically removed.

Figure 1J:
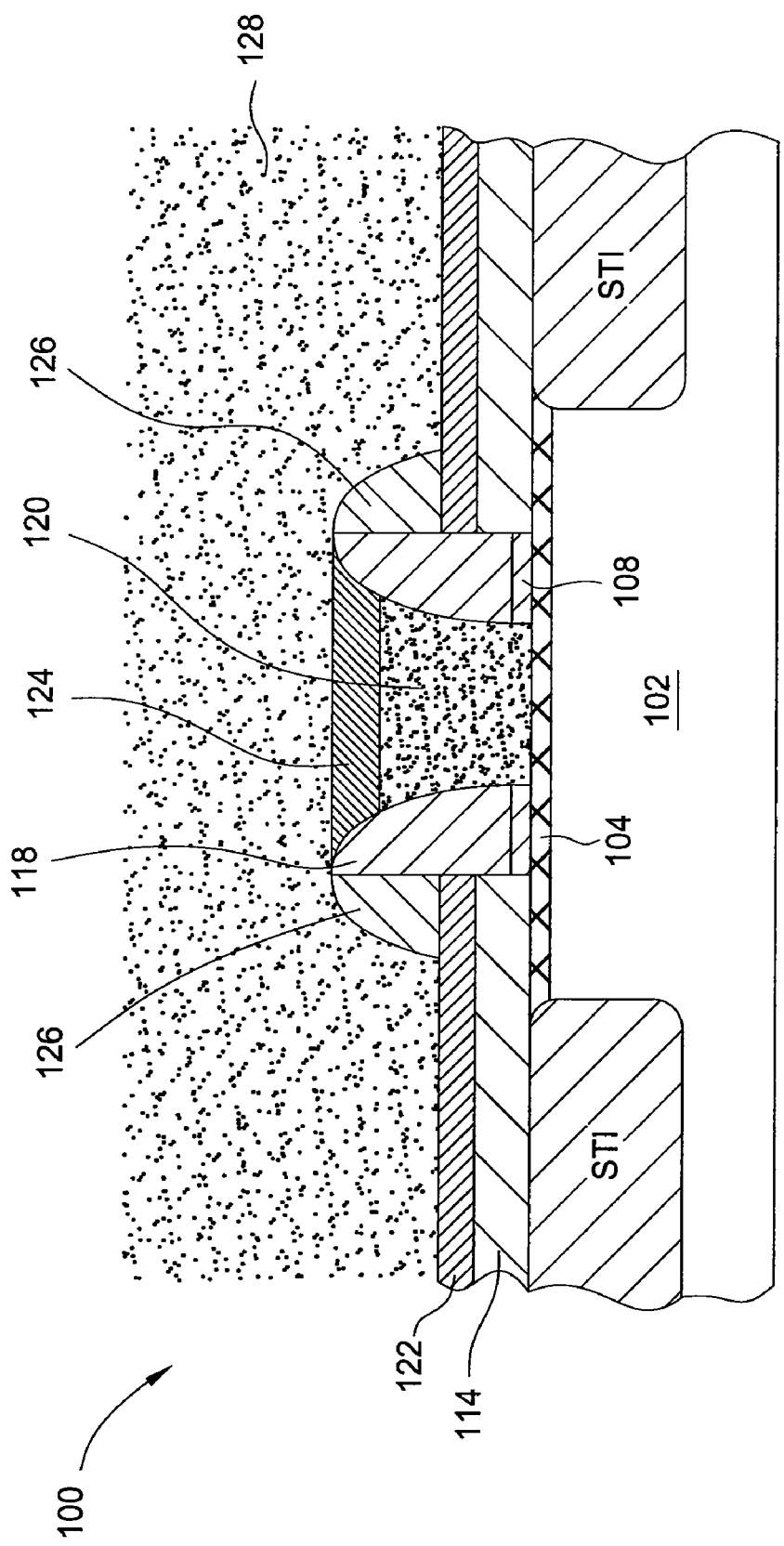

As illustrated in FIG. 1J, a second spacer is optionally deposited in the form of a third nitride layer 126, deposited over the metal germanide layer 122 on either side of the second nitride layer 118. A dielectric layer 128 (e.g., an oxide layer) is next deposited over the entire structure 100.

Figure 1K:
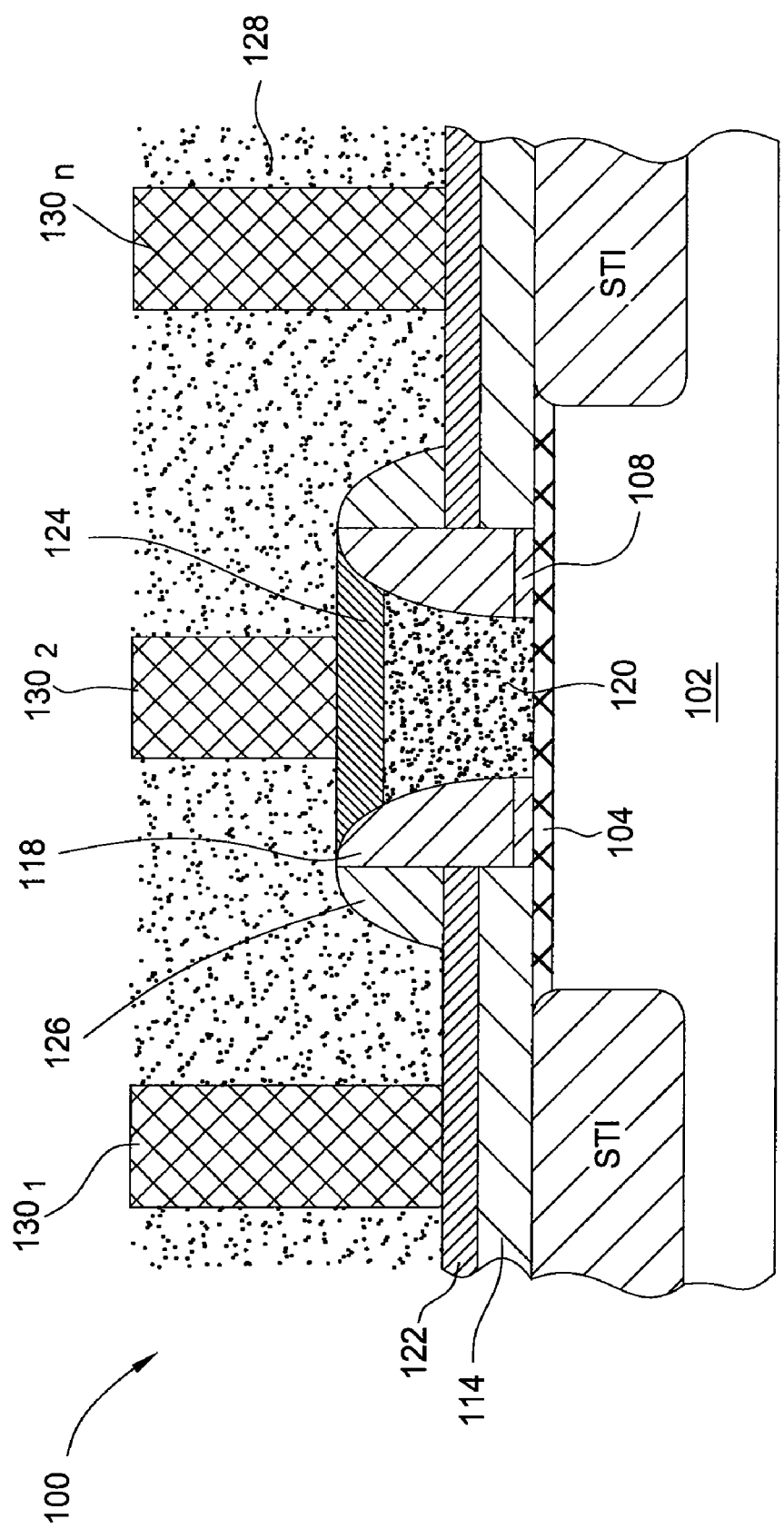

In the step illustrated in FIG. 1K, a plurality of metal contacts $130_1$-$130_n$ (hereinafter collectively referred to as "contacts 130") is formed in the structure 100. In one embodiment, the contacts 130 comprise copper or tungsten. In one embodiment, the contacts 130 include at least two contacts to the extrinsic base 114 (e.g., contacts $130_1$ and $130_n$) and at least one contact to the poly-silicon emitter 120 (e.g., contact $130_2$).

Figure 1L:
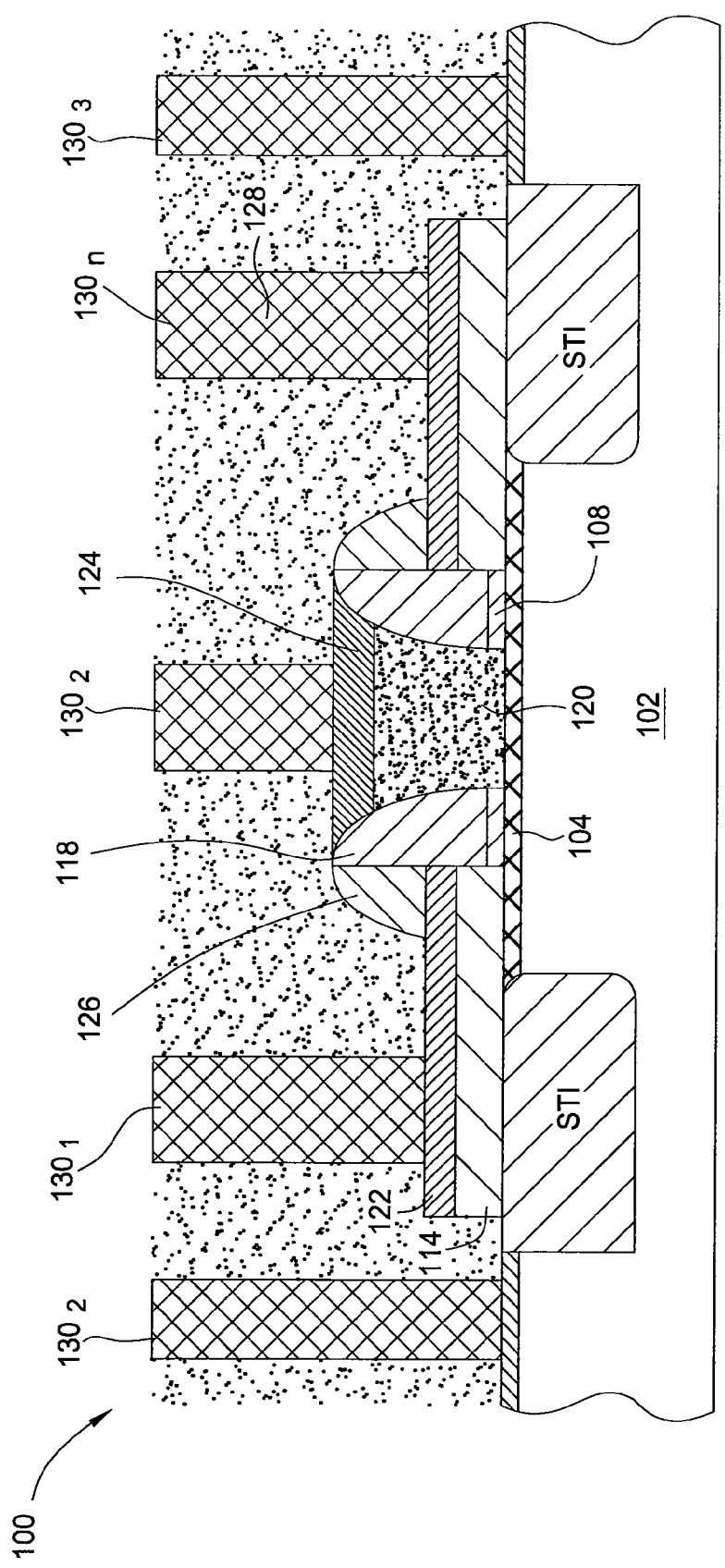

In the final step illustrated in FIG. 1L, the final bipolar device structure 100 is constructed by forming at least one more contact $130_3$ to the collector layer 102. In one embodiment, two contacts $130_3$ and $130_4$ are formed to the collector layer 102. Thus, in one embodiment, the bipolar device structure 100 includes at least two contacts to the extrinsic base 114 (i.e., contacts $130_1$ and $103_n$ in FIG. 1L), at least two contacts to the collector layer 102 (i.e., contacts $130_3$ and $130_4$ in FIG. 1L), and at least one contact to the poly-silicon emitter 120 (i.e., contact $130_2$ in FIG. 1L). In one embodiment, the contacts 130 are formed through a series of lithography, RIE, metal deposition, and CMP.

Base current runs through the HBT 100 through the contacts $130_1$ and $130_3$ (i.e., the contacts to the extrinsic base 114) to the metal germanide layer 122, through the metal germanide layer 122 to the poly-germanium extrinsic base 114, and through the poly-germanium extrinsic base 114 to the LTE layer 104. The use of germanium in the extrinsic base 144 reduces the resistance in the extrinsic base 114 ($R_b$). Specifically, the metal germanide-to-poly-germanium specific contact resistivity and the poly-germanium sheet resistance are reduced over HBTs that use silicide extrinsic bases. This ultimately improves the AC performance of the HBT 100, in particular for the maximum oscillation frequency, $f_{max}$.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A heterojunction bipolar transistor, comprising:
   a collector layer;
   an intrinsic base formed over the collector layer;
   an emitter formed over the collector layer and the intrinsic base; and
   an extrinsic base surrounding the emitter, the extrinsic base comprising:
      a first layer, the first layer comprising at least two different materials, the at least two different materials including near-single-crystalline germanium in regions directly above the intrinsic base and poly-germanium in regions not directly above the intrinsic base; and
      a second layer comprising a silicide-free metal germanide formed over the first layer.

2. The heterojunction bipolar transistor of claim 1, wherein the poly-germanium is boron doped.

3. The heterojunction bipolar transistor of claim 1, wherein the poly-germanium comprises p+ poly-germanium.

4. The heterojunction bipolar transistor of claim 1, wherein the metal germanide comprises nickel germanide.

5. The heterojunction bipolar transistor of claim 1, wherein the metal germanide comprises nickel platinum germanide.

6. The heterojunction bipolar transistor of claim 1, wherein the metal germanide comprises at least one of: titanium germanide, zirconium germanide, and ytterbium germanide.

7. The heterojunction bipolar transistor of claim 1, wherein the emitter comprises n+ poly-germanium and silicon.

8. The heterojunction bipolar transistor of claim 1, wherein the intrinsic base comprises boron-doped silicon germanium.

9. The heterojunction bipolar transistor of claim 1, further comprising:
   a plurality of contacts to the extrinsic base;
   a plurality of contacts to the collector layer; and
   at least one contact to the emitter.

10. A method for fabricating a heterojunction bipolar transistor, comprising:
    providing a collector layer;
    providing an intrinsic base formed over the collector layer;
    forming an emitter over the collector layer and the base region; and
    surrounding the emitter with an extrinsic base, the extrinsic base comprising:
       a first layer, the first layer comprising at least two different materials, the at least two different materials including near-single-crystalline germanium in regions directly above the intrinsic base and poly-germanium in regions not directly above the intrinsic base; and
       a second layer comprising a silicide-free metal germanide formed over the first layer.

11. The method of claim 10, wherein the emitter comprises n+ poly-germanium and silicon.

12. The method of claim 10, wherein the intrinsic base comprises p+ silicon germanium.

13. The method of claim 10, wherein the poly-germanium is boron doped.

14. The method of claim 10, wherein the poly-germanium comprises p+ poly-germanium.

15. The method of claim 10, wherein the metal germanide comprises nickel germanide.

16. The method of claim 10, wherein the metal germanide comprises nickel platinum germanide.

17. The method of claim 10, wherein the metal germanide comprises at least one of: titanium germanide, zirconium germanide, and ytterbium germanide.

18. The method of claim 10, further comprising:
    forming a plurality of contacts to the extrinsic base;
    forming a plurality of contacts to the collector layer; and
    forming at least one contact to the emitter.

19. A heterojunction bipolar transistor, comprising:
an intrinsic base;
an n+ poly-germanium and silicon emitter formed over the intrinsic base;
an extrinsic base surrounding the emitter, the extrinsic base comprising;
- a first layer, the first layer comprising at least two different materials, the at least two different materials including near-single-crystalline germanium in regions directly above the intrinsic base and poly-germanium in regions not directly above the intrinsic base; and
- a second layer comprising a silicide-free metal germanide formed over the first layer;

a plurality of contacts to the extrinsic base;
a plurality of contacts to the collector layer; and
at least one contact to the emitter.

20. The heterojunction bipolar transistor of claim 19, wherein the extrinsic base comprises p+ silicon germanium.

* * * * *